(12) United States Patent
Sack

(10) Patent No.: US 6,411,912 B1
(45) Date of Patent: Jun. 25, 2002

(54) VOLTAGE LEVEL BUS TRANSLATOR AND SAFETY INTERLOCK SYSTEM FOR BATTERY MODULES

(75) Inventor: Thomas T. Sack, Forest Hill, MD (US)

(73) Assignee: Alcatel, Paris (FR)

( * ) Notice: Subject to any disclaimer, the term of this patent is extended or adjusted under 35 U.S.C. 154(b) by 0 days.

(21) Appl. No.: 09/350,375

(22) Filed: Jul. 9, 1999

(51) Int. Cl.⁷ .......................... G01R 31/36; G06F 19/00
(52) U.S. Cl. ......................................... 702/63; 320/134
(58) Field of Search ............................ 702/63; 320/118, 320/119, 125, 112, 128, 134; 324/427, 434, 551

(56) References Cited

U.S. PATENT DOCUMENTS

| | | | |
|---|---|---|---|
| 4,839,633 A | * 6/1989 | Krenik | 340/661 |
| 5,256,916 A | 10/1993 | Thurnston | |
| 5,563,496 A | * 10/1996 | McClure | 320/128 |
| 5,578,927 A | 11/1996 | Perelle | |
| 5,619,417 A | 4/1997 | Kendall | |
| 5,622,789 A | 4/1997 | Young | |
| 5,652,498 A | 7/1997 | Edye et al. | |
| 5,666,040 A | 9/1997 | Bourbeau | |
| 5,670,861 A | 9/1997 | Nor | |
| 5,698,967 A | 12/1997 | Baer et al. | |
| 5,701,068 A | * 12/1997 | Baer et al. | 320/119 |
| 5,703,464 A | 12/1997 | Karunasiri et al. | |
| 5,773,962 A | 6/1998 | Nor | |
| 5,793,993 A | 8/1998 | Broedner et al. | |
| 5,850,351 A | 12/1998 | Lofty et al. | |
| 6,133,709 A | * 10/2000 | Puchianu | 320/116 |
| 6,184,656 B1 | * 2/2001 | Karunasiri et al. | 320/119 |

FOREIGN PATENT DOCUMENTS

WO    WO98 32181 A    7/1998

OTHER PUBLICATIONS

Patent Abstracts of Japan, vol. 017, No. 283 (E–1373), May 31, 1993 & JP 05 014171 A (Kawasaki Steel Corp), Jan. 22, 1993 *abstract*.

* cited by examiner

Primary Examiner—John S. Hilten
Assistant Examiner—Demetrius Pretlow
(74) Attorney, Agent, or Firm—Sughrue Mion, PLLC

(57) ABSTRACT

A serial communication interface including a bus voltage level translator and voltage safety interlock system is disclosed. According to a preferred embodiment of the invention, a voltage level translation interface (VLTI) is used to send Uplink and Downlink serial commands and data to a string of battery modules that result in large offset voltages. Through implementation of the VLTI design according to the various exemplary embodiments of the present invention, the addition of as many modules as required to form the desired battery voltage can be accommodated, while using low cost components. No optical couplers are required or other traditional DC blocking devices such as transformers, capacitors, or special isolation amplifiers in order to accommodate the large offset voltages. This is accomplished by level shifting each bit stream of commands up to the higher potential of the next module in the uplink data stream. Similarly in the downlink data stream, each bit stream is level shifted from the present potential to the lower potential of the next lower module.

17 Claims, 7 Drawing Sheets

VOLTAGE LEVEL BUS TRANSLATOR AND SAFETY INTERLOCK SYSTEM FOR BATTERY MODULES

BACKGROUND

The present invention generally relates to battery modules and in particular to connection and control of multiple battery modules.

Batteries and battery packs are used as power sources for many different applications. However, because of the variety of different applications that batteries can be used, each particular application typically has its own operating parameters including a voltage requirement. As a result, either the parameters associated with the battery must be designed to meet the particular application or individual batteries must be strung together to provide the required output voltage, for example. The first method is inefficient because the battery is limited in the number of applications in which it may be used. On the other hand, the second method has the problem associated with the potential for large offset voltages when a number of cells are connected together to form, for example, a high voltage battery.

High voltage batteries have many useful applications. For example, high voltage batteries may be used in vehicles as an alternative to conventional power sources. In order to provide a high voltage battery necessary for such an application, multiple batteries are placed in series to provide the desired output voltage. High voltage batteries may also be subjected to a wide range of different operating conditions. For example, battery operating conditions may change due to temperature, load, charging, age, etc, throughout the operational life of the battery. In order to ensure that the battery continues to operate at an optimal level, and to prevent damage to the battery or the area containing the batteries, it is also desirable to monitor the batteries and their individual cells. In particular, the batteries may be monitored for, among other things, over discharge conditions, under voltage conditions, and temperature variations.

Monitoring of high voltage batteries is difficult, however, because of the large offset voltages that occur from stringing multiple batteries together in series. In order to determine the local voltage level at any particular stage in the string of batteries the local voltage level must be determined with reference to that battery's high voltage and ground terminals. However, the ground of any individual battery fluctuates relative to the preceding battery's "high" voltage. Furthermore, any difference is compounded the further removed that any particular battery is removed from true ground. As a result, determining a battery's offset is not a trivial matter.

Monitoring devices that are connected to the cells of a high voltage battery must overcome the increased offset voltages as the monitoring device is connected to cells that are further from true ground. Conventionally, the large offset associated with high voltage batteries is overcome by providing galvanic isolation. Typical galvanic isolation techniques include the use of optical isolators, capacitors, or transformers. According to the use of these devices, the bandwidth of the isolation device must be carefully selected to match the bandwidth of information, based on the frequency of the information, that is being communicated to the monitoring equipment.

If the information being communicated to the monitoring equipment is in the DC or sub-hertz bandwidth, a telemetry system is often used to convert the data to a higher frequency band via analog to digital converters or through voltage-to-frequency/frequency-to-voltage devices. The converted higher frequency information is then transmitted across a galvanic isolation barrier to be interpreted as the information that is being monitored. The information that is to be monitored can be supplied through optical isolators as digital information. Alternatively, the information may also be provided through capacitor coupling or pulse transformers.

However, systems using galvanic isolation to overcome the large offsets associated with high voltage batteries have drawbacks in terms of both performance and cost. For example, although optical isolators have very high galvanic isolation performance, they are slow and very expensive. On the other hand, AC coupling provides a relatively low cost solution that grows in an amount inversely proportional to the frequency of the monitoring signal. In addition, AC coupling also causes large amounts of distortion to square-wave signals. For example, low frequency signals require very large capacitors. Transformers also become increasingly expensive and heavy as the frequency of the monitoring is lowered.

In addition, there are also important considerations with regard to the telemetry signal format that have to be taken into account when choosing the type of galvanic isolation that is to be used. For example, the waveform generated by Manchester encoding is easily accommodated by capacitor or transformer coupling since it is regular and continuous. Such a waveform contains a synchronized clock encoded in its content and is pulsewidth modulated. On the other hand, a Non-Return-to Zero (NRZ) data stream, sent through a serial communications interface to or from a PC RS-232 cable, for example, is not continuous and contains large DC components that are not transferable through AC or transformer coupling. As a result, the standard approach uses optical isolation for the type of telemetry needed for monitoring of battery modules.

Conventionally, if multiple batteries are strung together in series to provide a high voltage battery, any monitoring processor is connected directly, via optical couplers to each individual battery. As a result, this arrangement requires a large number of inputs to the host processor performing the monitoring operations. Furthermore, the host processor also has to maintain and manage a large number of separate communication links. This results in a large overhead that is added to the processor's responsibilities in addition to the expense associated with using optical isolators.

SUMMARY

It is therefore an object of the invention to control battery output in finite unit increments, while obviating the need for expensive components such as optical couplers.

It is another object of the invention to provide a simple and effective monitoring of a battery while reducing the communications overhead associated with the telemetry and monitoring performed by a host processor controlling the battery.

It is a further object of the invention to provide a redundant modular battery that is easy to monitor and that may be connected in any order to create a desired voltage output.

It is a yet further object of the invention to provide a robust modular battery capable of identifying and signaling battery conditions in addition to communicating and facilitating the identification of battery warnings and alarms.

According to an exemplary embodiment of the present invention, the foregoing and other objects are accomplished through implementation of a serial communication interface including a bus voltage level translator and voltage safety interlock system. According to a preferred embodiment of the invention, a voltage level translation interface (VLTI) is used to send Uplink and Downlink serial commands and data to a string of battery modules from a central monitoring processor. In addition, each module contains a transmitter, receiver, and microcontroller to monitor commands addressed to the module on the interface and provide answers to the central processor. In addition, an end module can initiate a warning signal to the central processor for various battery conditions via a safety interlock system in addition to the downlink communication path. Through implementation of the VLTI design according to the various exemplary embodiments of the present invention, the addition of as many modules as required to form the desired high battery voltage can be accommodated, while using low cost components. Furthermore, no optical couplers or other traditional DC blocking devices such as transformers, capacitors, or special isolation amplifiers are required in order to accommodate the large offset voltages associated with high voltage batteries. According to the invention, this is accomplished by level shifting each bit stream of commands up to the high potential of next module in the uplink data stream. Similarly in the downlink data stream, each bit stream is level shifted from the present potential to the lower potential of the next lower module. The level shifting can be achieved using standard transistor and resistor circuits providing a lower cost alternative to conventional galvanic isolation.

BRIEF DESCRIPTION OF THE DRAWINGS

The foregoing and other features, objects, and advantages of the invention will be better understood by reading the following description in conjunction with the drawings, in which.

DETAILED DESCRIPTION

Figure 1:
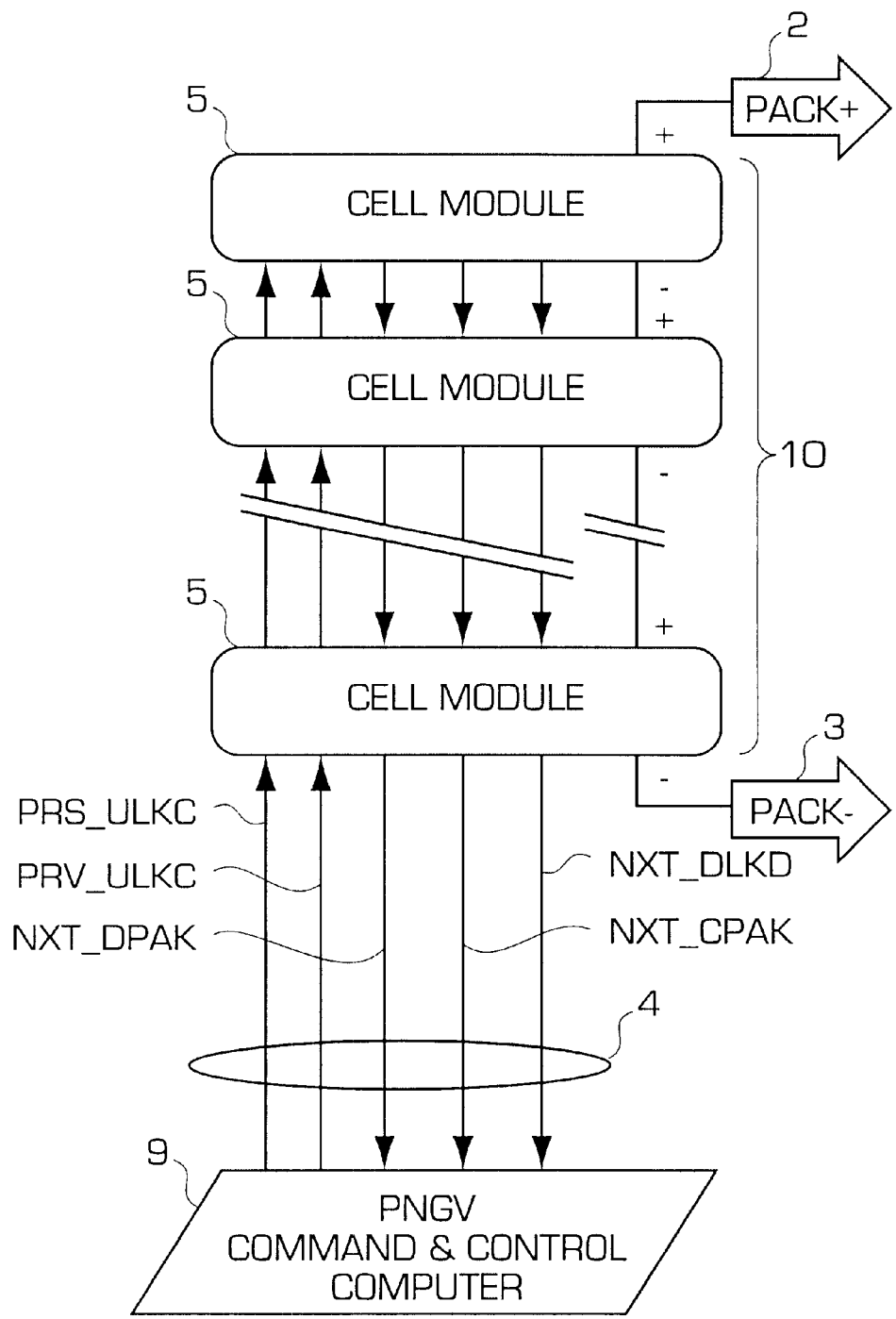
FIG. 1 illustrates an exemplary Level Voltage Translation Bus microprocessor controlled Li-ion modules.

The various features of the invention will now be described with respect to the figures, in which like parts are identified with the same reference characters.

As previously described, batteries can be configured for use in a number of different applications as power sources. Therefore, it is important, in some applications that are sensitive to changing conditions, to monitor and control the batteries in response to the changing conditions in order to obtain high performance from the batteries and prevent against conditions that may seriously damage the batteries or the applications in which the batteries are used. According to an exemplary embodiment of the invention, as shown in FIG. 1, such monitoring and control may be accomplished through the use of a Voltage Level Translation Interface (VLTI).

The VLTI includes a serial communications and safety interlock system that is useful in association with high voltage batteries, for example, among other applications. High voltage batteries typically are provided by connecting a desired number of batteries or packs in series in order to provide the voltage required by any particular application. Each of the cells in these batteries is monitored by a central processing system in order to ensure optimal battery operation. However, each cell has a different voltage offset relative to ground which must be taken into account in order to provide correct data to the operating system. The VLTI according to the present invention is able to overcome the voltage offset in a cost efficient and reliable manner as explained below.

VLTI Communication Overview

According to an exemplary embodiment of the invention, as shown in FIG. 1, a number of battery modules 5 are connected together to form a high voltage battery pack 10. The high voltage battery pack 10 has terminals 2 and 3 for discharging the battery to a load or application (not shown). Terminals 2 and 3 may also be used to charge the pack 10. Each of the modules 5 contain a number of battery cells (not shown). One skilled in the art will recognize that any number and type of cells and associated housing may be used without departing from the invention. However, according to one preferred embodiment of the invention, each module 5 includes 6 or 12 Li-ION cells. As a result of the invention's modular design, any number of modules 5 may be connected together in order to form a battery pack 10 having the desired output voltage. As a result, the battery back according to the present invention is easily adapted for use in any number of different applications.

Each module 5 is provided with a serial bus 4 which connects each module 5 with other modules 5 and the Host Command and Control Computer (HC&C) 9. The HC&C 9 communicates with each of the modules 5 forming the battery pack 10 in order to monitor and control the batteries associated with the module 5. According to an exemplary embodiment of the invention, the VLTI includes five communication lines; however, one skilled in the art, after reading this disclosure, will appreciate that the actual number of lines required for any particular application will depend on the number of signals and flags desired for a particular implementation of a communications protocol according to the teachings of the invention.

Uplink communication from the HC&C 9 to the modules 5 is provided via the PRS_ULKC and PRV_ULKC lines. Downlink communication from the modules 5 to the HC&C 9 is provided via the NXT_DPAK, NXT_CPAK, NXT_DLKD lines. The Uplink and Downlink communication lines and associated communication protocols of the VLTI are described in further detail below. According to one embodiment of the invention an RS232C protocol at 1200/2400/4800 baud, or higher, 8 bits per byte, one stop bit and no parity check is used for communication. According to this exemplary protocol sampling of the data bit requires that three successive samples agree before accepting the bit in order to reject unnecessary noise.

The VLTI provides serial data including command and control instructions from the HC&C 9 to the battery modules 5. The VLTI is also used to receive unsolicited urgent, safety downlink data via interlock signals (e.g., via NXT_DPAK and NXT_CPAK) and solicited telemetry downlink data (e.g., via NXT_DLKD ) sent from the modules 5 to the HC&C computer 9 which are also described in further detail below.

VLTI Operation

Figure 2:
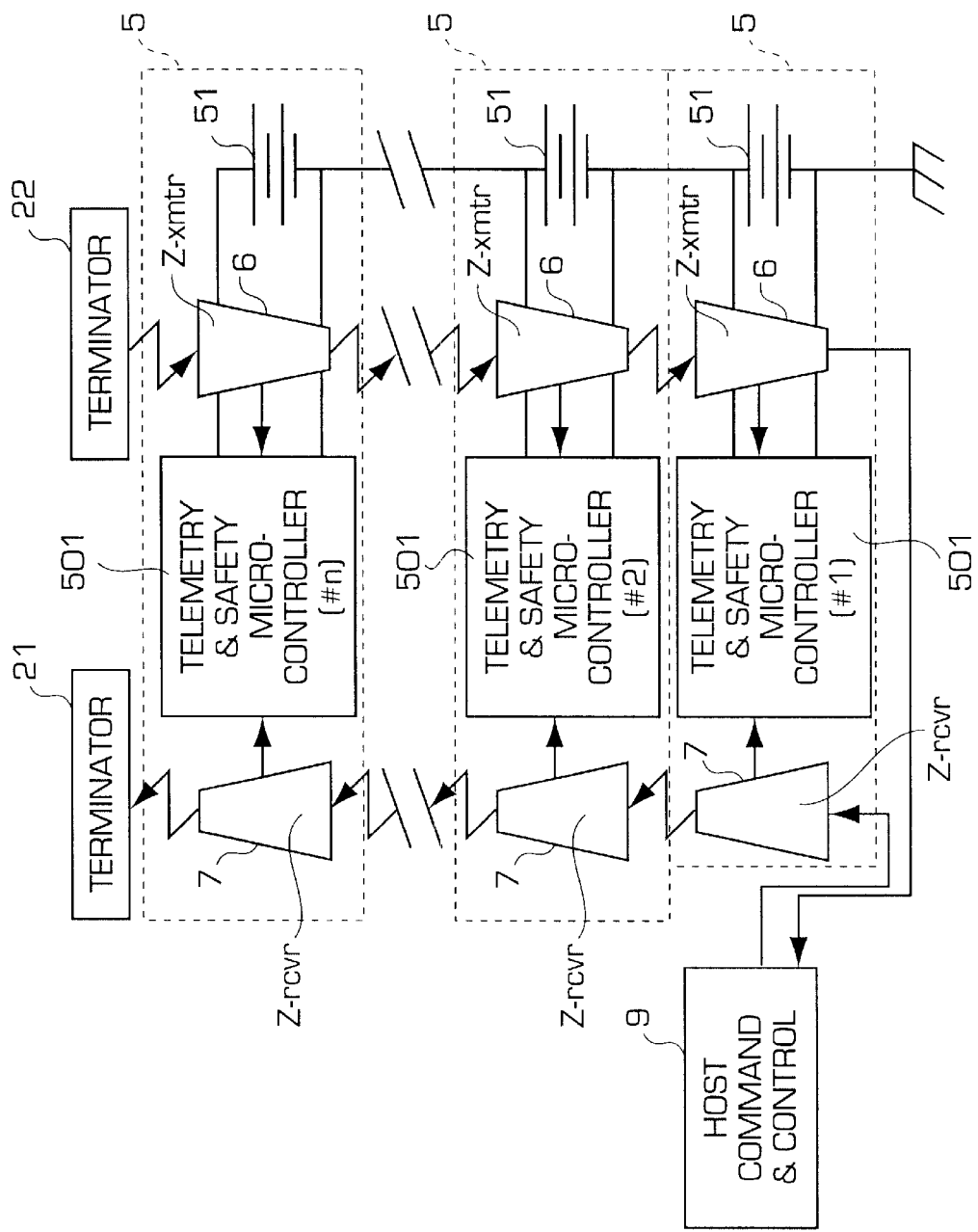
FIG. 2 shows an exemplary Level Voltage Translation Bus Uplink and Downlink response and telemetry.

According to an exemplary embodiment, as shown in FIG. 2, each module 5 includes a VLTI receiver 7, transmitter 6, a telemetry and safety microcontroller 501 in addition to a number of cells 51. The module components are powered by the cells 51 that are associated with each module. The receivers 7 receive information and commands from the HC&C 9. The microcontrollers 501 monitor the Uplink via receivers 7 for information transmitted from the HC&C 9 that is addressed to the receiver's module 5. According to this exemplary embodiment, each receiver 7 and associated microcontroller 501 only read and process the information addressed to their associated module 5. The transmitters 6 form a Downlink data channel. Data response issued on the Dowlink data channel proceed from the module issuing the data response to the lower modules before ultimately being received by the HC&C.

The voltage offsets are determined by the design of each module and are limited to the finite number of cell voltages provided in each module. As a result, the voltage offset for each individual module is fixed and known within the module. This allows the level translator receivers 7 and transmitters 6 to leverage the signal voltages up or down one module at a time. In other words each module level shifts each bit stream of commands up to the higher potential voltage of the next module in the uplink data stream. Similarly in the downlink data stream, each module levels shifts each bit stream of messages from the present potential to the lower potential voltage of the next lower module.

According to this embodiment of the invention, each microcontroller 501 is concerned with the voltage offset of the individual module. As a result, as many boards as needed may be linked together without having to account for the overall voltage offset from ground that is normally associated with a high voltage battery pack. Therefore, according to this embodiment of the invention, great flexibility is provided to designers as the modules may be arranged and connected in any order to meet the voltage required by the application. In addition, if any particular module fails it may be easily replaced by a new module. Furthermore, the design of each module is the same allowing the modules to be easily mass produced and replaced at an overall lower cost.

Figure 5:
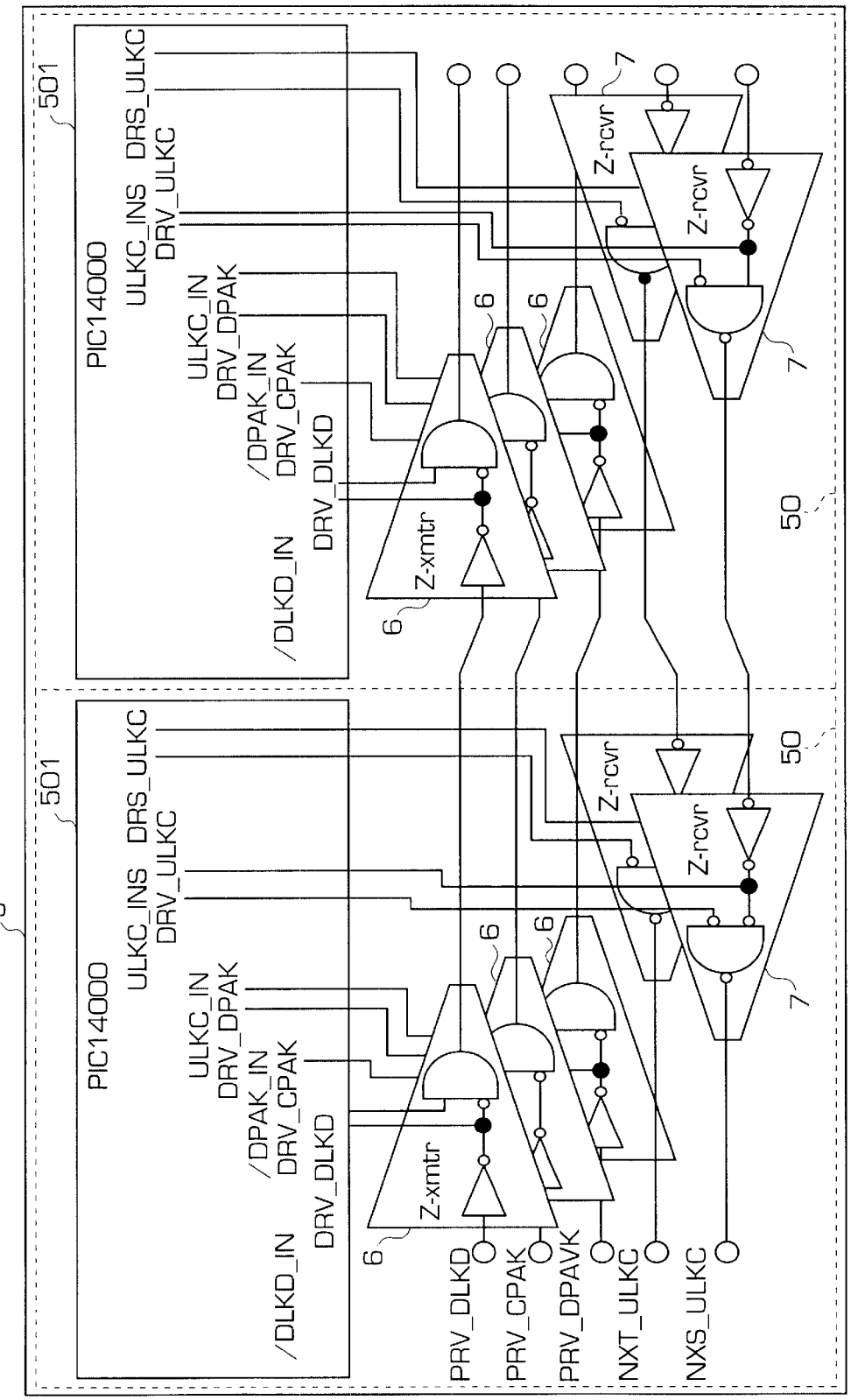
FIG. 5 shows an exemplary Voltage Level Translation Interface block diagram for an exemplary battery module.

According to one alternative embodiment of the invention, as shown in FIG. 5, a module 5 contains two boards 50 connected in series. According to this embodiment, each board 50 has a Telemetry and safety Microcontroller 501 that monitors and controls 6 cells to make a total of 12 cells per module 5. VLTI Uplink and Downlink serial command and data are connected as shown in FIG. 5.

VLTI Downlink Data and Safety Interlocks

Figure 3:
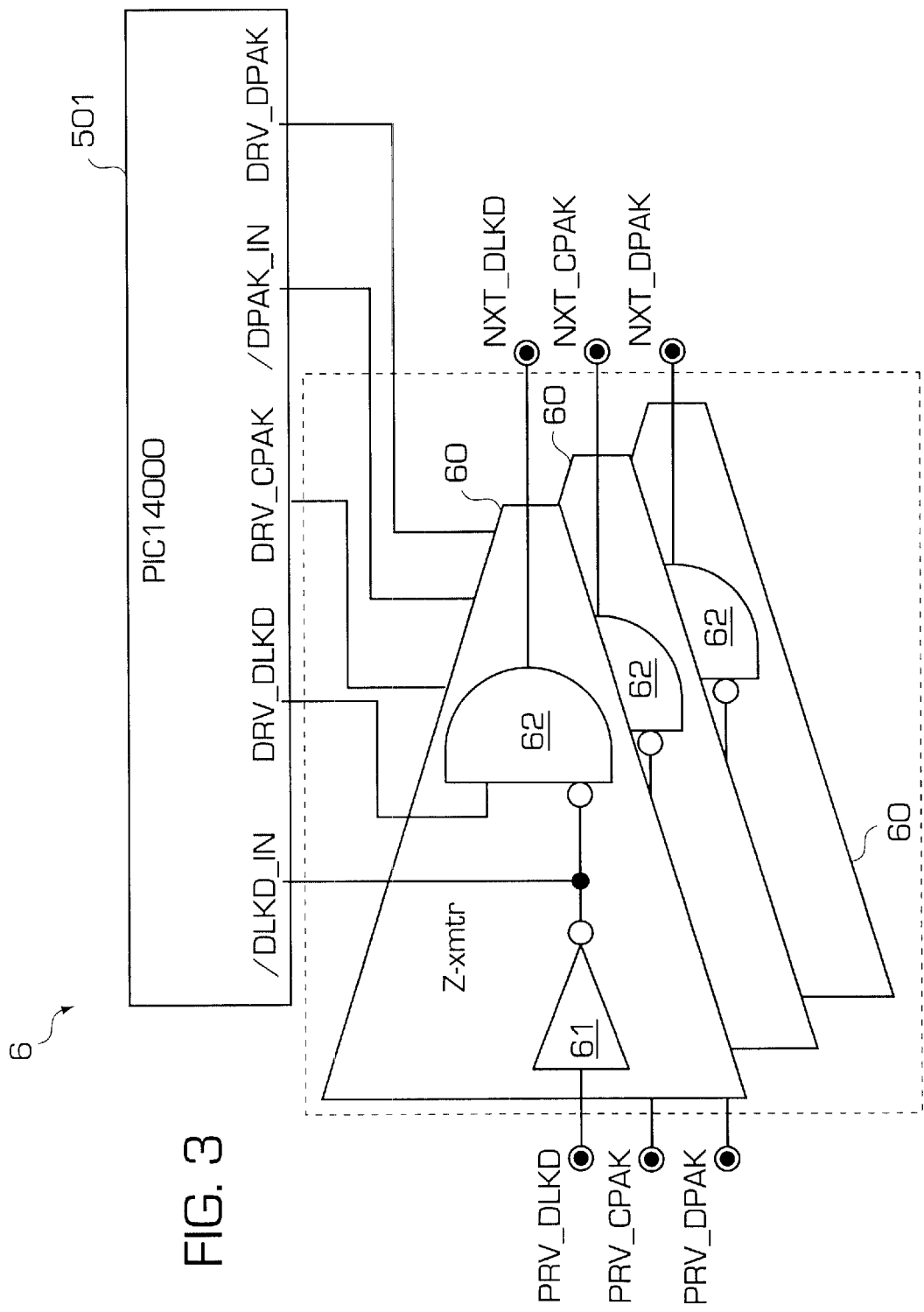
FIG. 3 shows an exemplary Downlink Transmitter Logic diagram according to an exemplary embodiment of the invention.

Turning to the exemplary embodiment shown in FIG. 3, the VLTI has three VLTI Downlink transmitters 60 (Z-xmtr) that are substantially electrically and functionally interchangeable. According to this exemplary embodiment, one of the transmitters 60 has the CPAK Interlock that does not have a CPAK_IN signal connected to the microcontroller 501 due to pin limitations. The logical design of the three transmitters is shown in FIG. 3. The first stage 61 receives the signal voltage from a previous module and translates the voltage to the nominal logic levels of HIGH (5V) or LOW (0V) relative to the ground of the local microcontroller 501. The logic of the input signal becomes inverted and is sent to the local microcontroller 501. The inversion is compensated for in the microcontroller 501. The microcontroller 501 then allows the signal to continue down the serial bus 4 by holding the drive signal to the output buffer 62 at logic 1.

According to this exemplary embodiment, any of the local microcontroller's 501 may take command of the Downlink and will be recognized by all transmitters 6 below it. At the same time the local microcontroller 501 must remove itself from the bus when a transmitter 6 above it takes command of the bus.

VLTI Uplink Command

Figure 4:
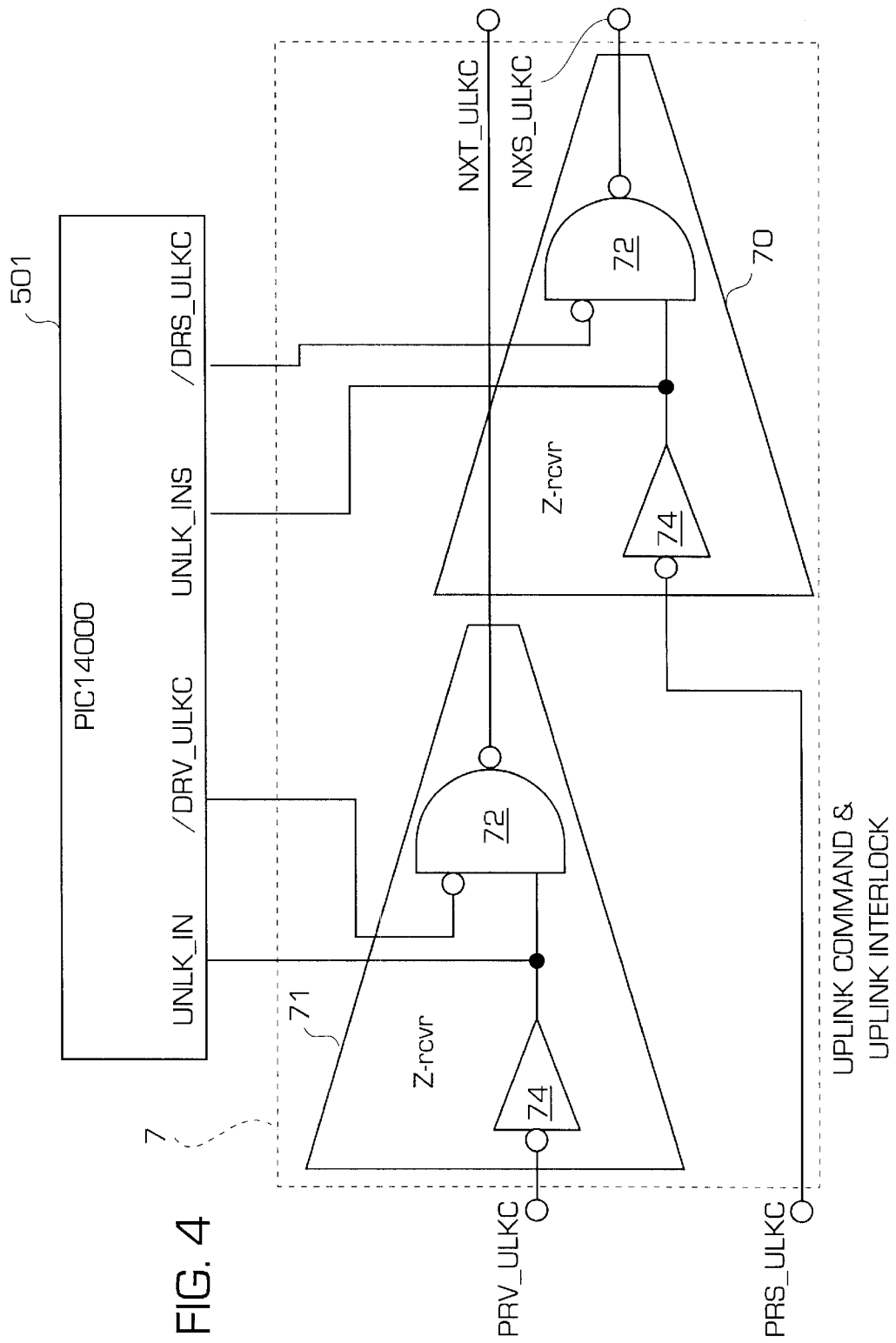
FIG. 4 shows an exemplary Uplink receiver logic diagram according to an exemplary embodiment of the present invention.

The receiver 7, as shown in FIG. 4, has two VLTI Uplink receivers (Z-rcvr) 70 and 71 associated with each microcontroller 501. The first receiver 71 is used primarily for the uplink command flow. The second receiver 70 is used for communication handshaking between the modules 5 to prevent more than one module 5 from responding to messages from the HC&C 9 at the same time.

The logical design of receiver 7 according to one exemplary embodiment is shown in FIG. 4. The first stage 74 receives an active low signal voltage from the HC&C 9 or a previous lower module 5 and translates the voltage to the nominal logic level of 1 (5V) or 0 (0V) relative to the ground of the local microcontroller 501. According to this process, the logic of the signal becomes non-inverted and is sent to the local microcontroller 501. The microcomputer 501 then allows the signal to continue up the serial bus 4 by holding drive signal at logic 0. The output is then re-inverted in the output buffer 72. Any of the local microcontroller's 501 may take command of the Uplink and will be recognized by all VLTI receivers 7 above it. This communication process is defined by the communication protocol.

VLTI Downlink Transmitter Design

Figure 6:
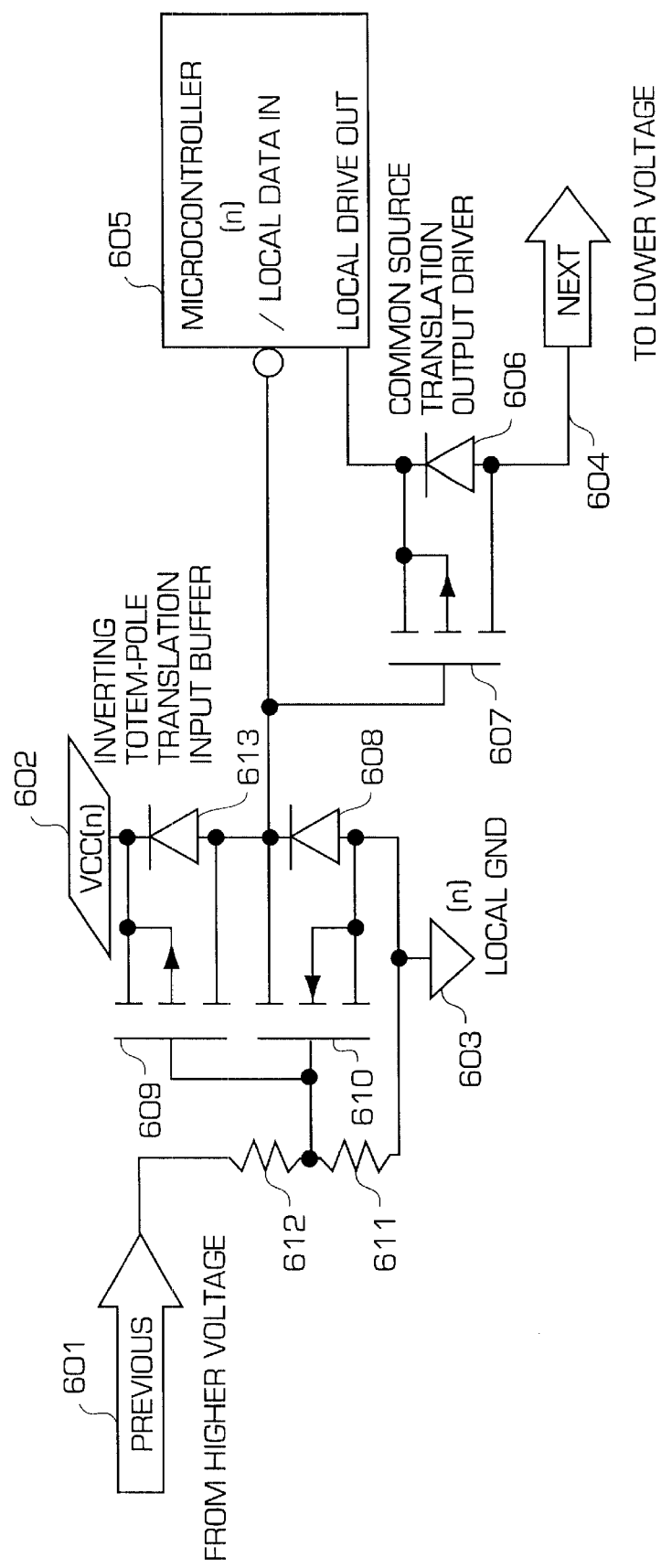
FIG. 6 shows an exemplary Downlink transmitter according to the invention.

According to one embodiment of the invention, an exemplary VLTI Downlink transmitter circuit 6 is shown in FIG. 6. The transmitter 6 includes of three transistors 609, 610, and 607, wired with the first transistor pair 609 and 610 in an inverting Totem-Pole configuration that acts as an inverting level-translation buffer. This circuit can be replaced by a single transistor translation buffer at the cost of a higher standby current consumption. In addition, although FIG. 6 shows the circuits as being implemented with Field Effect Transistors, a skilled artisan would appreciate that Bipolar Junction Transistors of appropriate selection could also be used. The signal from the previous stage is higher in offset voltage and is reduced by the input resistor divider 612 and 611. According to an alternative embodiment a reduction in the series values of the resistors will increase the operating speed of the communication interface; however, power consumption will also be increased. One skilled in the art will recognize that the actual values of the resistors 611 and 612 are sized according to the particular system's implementation requirements.

The third transistor 607 is wired to act as a common gate non-inverting buffer when the local microcontroller 605 is sending data and an inverting common source when the previous transmitter is sending data that is being allowed to pass through the module, for example, in the case where a data response is being passed down from a higher module. In order to pass on the data from the previous module, the local microcontroller 605 must hold the source at a HIGH (5V). The drain is then allowed to float downward to the next offset voltage level as long as the gate to source voltage is set at a 5V difference. In this manner the transistor 607 acts substantially as a logical AND buffer 62.

VLTI Uplink Z-rcvr Design

Figure 7:
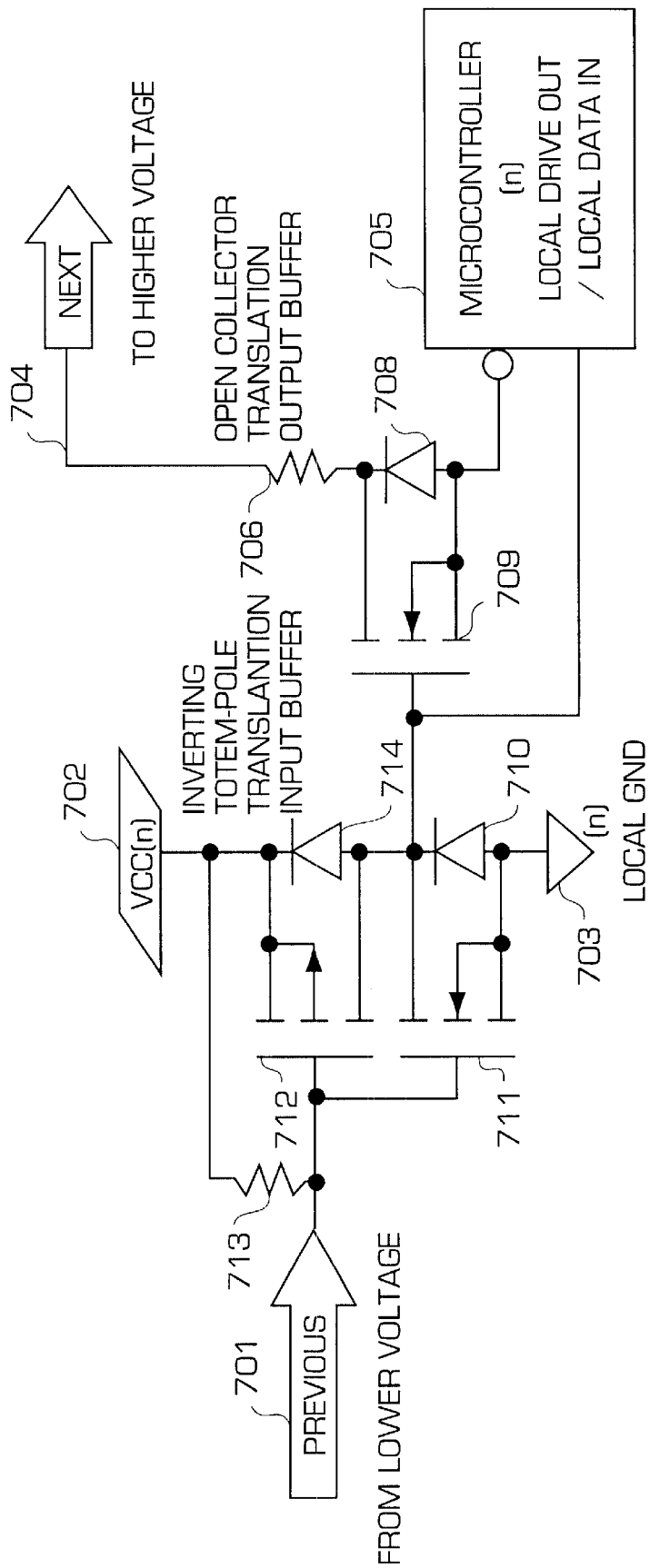
FIG. 7 shows an exemplary Uplink receiver according to the invention.

According to another embodiment of the invention an exemplary VLTI Uplink receiver circuit 7 is shown in FIG. 7. The receiver 7 includes three transistors 709, 711, 712 wired with the first transistor pair 711 and 712 in an inverting Totem-Pole configuration that acts as an inverting level-translation buffer. This circuit can be replaced by a single transistor translation buffer at the cost of a higher standby current consumption. In addition, although FIG. 7 shows the circuits as being implemented with Field Effect Transistors, a skilled artisan would appreciate that Bipolar Junction Transistors of appropriate selection could also be used. The signal from the previous module 5 is lower in offset voltage and is reduced by the input resistor divider 713. According to an alternative embodiment, a reduction in the value of the resistor 713 will increase the operating speed of the communication, however, power consumption will also be increased. One skilled in the art will recognize that the actual values of the resistors are sized according to the system's particular implementation requirements.

The third transistor 709 is wired to act as a common open collector, non-inverting level-translation buffer when the local microcontroller 705 is sending data and an inverting common source when the previous receiver 7 is sending commands that are being allowed to pass through the module on its way up from the HC&C 9. The local microcontroller 705 must hold the source of transistor 709 at a LOW (0V) in order to pass the data along. The drain of transistor 709 is then allowed to float upward to the next offset voltage level as long as the gate to source voltage is at a 5V difference. In this manner it acts as a logical NAND buffer 72.

VLTI Hardware Interface VLTI Interlock Interface

Certain conditions should be quickly reported to the HC&C 9 for immediate action, for example, to avoid damage to the battery pack. Examples, of conditions that should be immediately report include over voltage, over discharge, and over temperature conditions. Therefore, in addition to the serial communication interface, according to another embodiment of the invention, a safety interlock interface is also provided to respond quickly prespecified conditions. While these conditions can be reported over the serial bus in response to an inquiry of the HC&C 9, the safety interlock is provided so that each module can immediately alert the HC&C 9 without having to wait for the opportunity to transmit a response or respond to a periodic message.

According to an exemplary embodiment the bus is made of six lines: a downlink data line; an uplink data line; an uplink transmission request data line; a downlink safety CGATE interlock; a downlink safety DGATE interlock, and a local ground reference. In addition to the bus, which connects one module to the other, each module must manage other internal signals that indicate or set the activity status of the bus condition.

The VLTI Downlink interlock protocol for sending high urgency messages is as follows. During normal operation of the cells both DRV_CPAK and DRV_DPAK are set high. However, when a cell voltage rises above a first predefined value the DRV_CPAK is set to a LOW state thereby indicating an overcharge. When a cell voltage goes below a predefined value the DRV_CPAK is set to a HIGH state. When a cell voltage is below a second predefined value the DRV_DPAK is set to a LOW state to indicate an overdischarge condition. On the other hand when a cell voltage is above this value the DRV_DPAK is set to a HIGH state thereby indicating that that overvoltage condition has passed. Finally, a temperature sensor (not shown) is provided to monitor the battery temperature. When the temperature sensor indicates that conditions are too hot both the DRV_CPAK and DRV_DPAK are set to a LOW state. One the other hand, if the temperature sensor indicates a normal operating temperature then both the DRV_CPAK and DRV_DPAK are set to a HIGH state.

Software Protocol

According to an exemplary embodiment each module 5 has its own address from 1 (0x01) to 15 (0x0F), and 16 (0x00). A global call is addressed to all modules and uses a 0 address. A module 5 will respond to a command byte containing its own address or the global call address (0x00) when the command is appropriate.

A quick command contains two bytes. The $1^{st}$ nibble (4 most significant bits) contains the command and the $2^{nd}$ nibble (4 least significant bits) contains the board address. According to this embodiment the second byte will contain the complemented version of the first byte. For example: 0x 53 0xAC provides two bytes that are separated by a wait period of approximately 5mS period of time. The module 5 then checks each command for the proper complementation by using an exclusive (XOR) function on a bit-by-bit basis. If the complement is incorrect or the command is an invalid command, then the module board number (defined by "m" as described below) will respond with a COMM_ERROR message defined below. An alternative to this approach is to use "checksums" to facilitate communication error detec tion. Quick Commands may include, for example CLEAR_ALARM; HIBERNATE; ACTIVE; SAMPLE_HOLD; RESET_EE; CALIBRATE; GET_VOLT; GET_TEMP; GET_STATUS; and GET_GAINS.

A word command is defined as the first two bytes and error processing commands are identical to the quick command where the second two bytes contain data. For example:

| Cmd code | Significance | Expected answer/action from the board |
|---|---|---|
| 0x30 0xCF | BALANCE | Board should balance the 6 cells to a voltage defined in the 2 bytes of data |

According to an exemplary embodiment in Read/Write Word commands the first two bytes and error processing are identical to the quick command and the second two bytes contain address and data. For example:

| Cmd code | Significance | Expected answer/action from the module |
|---|---|---|
| 0xCm 0x3M 0xWaddr 0xData | GET_EEPROM | Module should read the MSB of the Waddr byte to determine if the following byte should written (0) into the EEPROM at location given by the 7 LSB or read (1) from that location. In the case of the read, the second byte is ignored. |

"m"=Module Address
"M"=Complement of Module Address

A command Response is provided to avoid communication traffic conflict. For example, the HC&C 9 does not send a global address with a command that requires all module boards to send data. In contrast, the modules will be individually addressed for telemetry data. According to this embodiment, those commands that are global in nature require that a STATUS_REQUEST or an appropriate telemetry request be issued to insure that the command was successfully interpreted.

According to another exemplary embodiment, the modules 5 are not permitted to send an alarm or warning message more than one time. Therefore, a CLEAR_ALARM message is sent by HC&C 9 to check if an error condition persists by clearing the module board error status flags.

The HC&C 9 Command Set is given in the table below to provide a exemplary listing of commands and their appropriate response from the module boards. One skilled in the art will realize that this list of commands is not exclusive and that other commands could be contemplated after reading this disclosure.

C&C 9 Command Set Table

| Cmd code | Command Sent by PC | Resp code | Response from Module to PC | Expected answer/action from the board |
|---|---|---|---|---|
| 0x00 0xFF | CLEAR_ALARM | — | | Clears stored alarm or warning messages that are only allowed to be sent one time |
| 0x10 0xEF | HIBERNATE | — | | Module should go in hibernate mode |
| 0x20 0xDF | ACTIVE | — | | Module should go to full speed scan mode |
| 0x30 0xCF | BALANCE | — | | Module should go into Balance Mode. Use the next two bytes to determine balance voltage |
| 0x40 0xBF | SAMPLE_HOLD | — | | Sample and hold voltages and temperatures |
| 0x5m 0Xam | RESET_EE | 0x5m | EE_RESET | Reset EEPROM |

-continued

C&C 9 Command Set Table

| Cmd code | Command Sent by PC | Resp code | Response from Module to PC | Expected answer/action from the board |
| --- | --- | --- | --- | --- |
| 0x6m 0x9M | CALIBRATE | 0x6m | SEND_CAL | Module executes calibration routine |
| 0x7m 0x8M | GET_VOLT | 0x7m | SEND VOLT | Send the 6 sampled voltages in mV |
| 0x8m 0x7M | GET_TEMP | 0x8m | SEND TEMP | Send the 3 sampled temperatures in ° C.*10 |
| 0x9m 0x6M | GET_STATUS | 0x9m | SEND_STATUS | Module should return mode and balance status |
| 0xAm 0x5M | GET_GAINS | 0xAm | SEND_GAINS | Module should return the 6 Voltage gains |
| 0xBm 0x4M | SET_ADDRESS | 0xBm | NEW_ADDRESS | Initialize Module address |
| 0xCm 0x3M | GET_EEDATA | 0xCm | SEND_EEDATA | Send Contents of EEPROM |
| 0xDm0x2M | START_RENUM | 0xDm | INITIALIZE | Reset Initialization Message |
| 0xEm 0x1M | STOP_RENUM | 0xEm | COMM_ERROR | Communication Error Response |
| 0xFm0x0M | — | 0xFm | URGENT | Alarm & Warning Response |

Module Re-Identification

When receiving the START_RENUMbering global command 0xD0 0x20, for example, the following sequence of events will take place. First, all modules 5 turn OFF their UPLINK drive pin. Then, all modules 5 erase their present address which becomes the global address 0x00. The HC&C 9 will then send a string of SET_ADDRESS commands, with appropriate complemented command, made of increasing numbers from 0xB1 to 0xBF, followed by 0xB0. The first module in the line is the only one capable of reading the first number (0xB1) and will take it as its own address. It will then turn its UPLINK drive ON and disregard the following numbers.

Each module, in turn, will then read the renumber command. If their address is 0x00, it will then accept the SET_ADDRESS message value as the new assigned module number. If their address is not 0x00 then the command will be ignored. Each re-numbered module will then turn its UPLINK drive ON and disregard the following numbers. Each module then indicates that it has received a new address through a NEW_ADDRESS response to the HC&C 9. There is a normal communication delay between each command as defined below to allow processing to take place. The last communication to the module boards shall be a STOP_RENUMbering command to indicate that the process is finished. In this manner, module can be easily added or reconfigured in the result of battery failure, for example. As a result, the modular design provides great flexibility to be used in a number of different applications.

0xD0 0x2F wait 0xB1 0x4E wait 0x B2 0x4D - - - 0xB0 0x4F wait 0xE0 0x1F

Module board to Host Command Computer DOWNLINK communication

According to the next embodiment of the invention, each downlink communication starts with a byte having a structure similar to the uplink quick command byte. The 1 st nibble contains the command code the module 5 that is responding to a command, for example, 0x5 when answering to a GET_VOLT command. The 2nd nibble contains the module address (m) where m=0x_1 for board 1, 0x_2 for board 2, etc. to 0x_0 for module 16. For additional security in the communication process, an additional byte of data containing the checksum can be appended to allow the HC&C 9 to determine the veracity of the transmitted message. Other error detection and corrections schemes that could be used included Cyclical Rendundancy Coding and correction algorithms such as convolutional coding. To inform the HC&C 9 that the module has reset the EE_PROM calibration marker using the command code "0x5m".

INITIALIZE:

0x5m

To answer the GET_VOLT command, the module adds 12 bytes to the communication message corresponding to the 6 voltages in millivolts (e.g., in a six cell module Cell 1 LSB first, cell 6 MSB last). A graphic user interface (not shown) is then responsible for adding the decimal point before display.

SEND_VOLT Response:

| 0 x 7m | Cell 1 LSB | Cell 1 MSB | Cell 2 LSB | Cell 2 MSB | ... | Cell 6 LSB | Cell 6 MSB |
| --- | --- | --- | --- | --- | --- | --- | --- |

According to another exemplary embodiment, to answer a GET_TEMP command, the module adds 6 bytes to the communication message corresponding to the 3 temperatures in ° C.*10 (PIC internal temp LSB first, Sensor 2 MSB last). Again, the graphic user interface adds the decimal point before display.

SEND_TEMP Response:

| 0 × 8m | Ta LSB | Ta MSB | T1 LSB | T1 MSB | T2 LSB | T2 MSB |
|---|---|---|---|---|---|---|

To answer a GET_STATUS command, the module adds two bytes to the communication message, the first one being the actual mode (e.g., 0=hibernate, 1=balancing, 2=full speed) and the second being representative of the balancing status and C and Dgate interlock.

SEND_STATUS Response:
0x9m MODE STATUS
STATUS BYTE Contents:

| Bit | 7 | 6 | 5 | 4 | 3 | 2 | 1 | 0 |
|---|---|---|---|---|---|---|---|---|
| | C_Gate | D_Gate | Bal_G6 | Bal_G5 | Bal_G4 | Bal_G3 | Bal_G2 | Bal_G1 |

In order to answer a GET_GAIN command, the module adds 18 bytes to the communication message corresponding to the 6 voltages gains (G1EXP first, G6B1 last). This number format is in a hex floating point system that is used within the module's microcomputer 501. According to one embodiment of the invenition, it can be used as a check reference for debugging purposes. Alternatively, these numbers can be stored in the HC&C 9 for possible regeneration of calibration values in the event of a module failure. According to on embodiment of the invention, the floating point conversion used by the VLTI system is defined by Microchip Corporation and is expressed as follows:

$$GAIN_{DECIMAL}=[(GnB0*256)+GnB1+32768]* 2^{GnBEXPO-142}$$

Where all values entered into equation are base 10.

| | | |
|---|---|---|
| Example: | $GnB0 = 50_{16} = 80_{10}$ | |
| | $GnB1 = 50_{16} = 80_{10}$ | |
| | $G_NBXP = 8A_{16} = 138_{10}$ | |
| Results: | $GAIN_{DECIMAL} = 3333_{10}$ | |

SEND_GAIN Response:

| 0 × am | GI EXP | GI B0 | GI B1 | G2 EXP | G2 B0 | G2 B1 | ... | G6 EXP | G6 B0 | G6 B1 |
|---|---|---|---|---|---|---|---|---|---|---|

In order to answer a GET_EEPROM command, the module will add two bytes to the communication message; the first one being the address of the EEPROM location to be read and the second is the contents of the EEPROM.

SEND_EEDATA:

0xCm EEADDRESS EEDATA

To inform the HC&C 9 that the module has determined that it is confused an auto-reset is issued and reported using the response code "0xDm".

INITALIZE:

0xDm

To inform the HC&C 9 of a bad/incomplete communication reception, the module sends the response code "0xEm" followed by the two bytes of the commands that it received and tried to decode.

COMM_ERROR Response:

0xEm

In order to send an alarm or warning message, the module sends two bytes using the response code '0xFm' followed by the alarm byte that is defined below and two bytes that contain the data value that was declared to be out of normal range.

Alarm/Warning Response:

0xFm ALARM_BYTE LSB MSB

ALARM_BYTE structure:

| Bit 7 | 6 | 5 | 4 | 3 | 2 | 1 | 0 |
|---|---|---|---|---|---|---|---|
| Alarm Code | | | | Channel number | | | |
| 0000 | over | Voltage | Alarm | 0000 | | V1 | |
| 0001 | Over | Voltage | Warning | 0001 | | V2 | |
| 0010 | Under | Voltage | Alarm | 0010 | | V3 | |
| 0011 | Under | Voltage | Warning | 0011 | | V4 | |
| 0100 | Over | Temp. | Alarm | 0100 | | V5 | |
| 0101 | Over | Temp. | Warning | 0101 | | V6 | |
| | | | | 0110 | | T1 | |
| 1010 | Temp. | Gradient | Alarm | 0111 | | T2 | |
| 1011 | temp | Gradient | Warning | 1000 | | T1–Ta | |
| | | | | 1001 | | T2–Ta | |
| 1100 | Volt | Gradient | Alarm | 1010 | | Vmax–Vmin | |
| 1101 | Volt | Gradient | Warning | | | | |

Communication Process Flow

The communication process flow operates according to a modified polled telemetry system. The basic rules of communication between the HC&C 9 and the modules are described as follows. HC&C 9 Uplink messages have a preliminary wait time of one byte time period between the end of the previous downlink and the beginning of the new uplink. However, modules' telemetry information is sent only upon request. One response message is sent from the module board that has been addressed.

Urgent messages sent from the modules to the HC&C 9, such as WARNING, ALARM or COMM_ERROR, are allowed only within the allocated time slot immediately after any uplink command is received to avoid uplink and downlink messages from occurring at the same time. Module boards execute an autoreset when three successive uplink commands that were in error or unable to be decoded were received. The modules then report this initialization to the HC&C 9.

Urgent messages are allowed from any module within the allocated time slot after any uplink command is received. It is assumed that more than one board may be trying to send an urgent message, so the HC&C 9 should be able to process more than one urgent message at a time. In addition, urgent messages may be sent from any module even if the command is addressed to another module board. Urgent messages have a preliminary wait time of one byte time period between the end of the uplink and the beginning of the downlink because of their higher priority.

Telemetry messages have a preliminary wait time of two byte periods between the end of the uplink and the beginning of the downlink in order to allow urgent communications to begin. The HC&C 9 does not send any uplink messages during the time allocated for downlink responses. In other words, according to this exemplary embodiment one command should result in one normal response. No other commands should be sent until the last response has been received within the allocated time. The HC&C 9 checks the response message header and length for appropriateness compared to the uplink last sent. In this case, the response message header should match the command and the number of bytes should be the proper length within a limited time. The HC&C 9 also checks the data values that are contained within the response from the module for appropriate scale and retest those telemetry values that are out of normal operating range. The HC&C 9 edits its command message queue in order to respond appropriately to received urgent messages. The HC&C 9 repeats uplink commands for which it receives an indication that the first attempt was not received properly. Telemetry verification of voltages or temperatures that have caused warning or alarm messages can also be requested by the HC&C 9.

The HC&C 9 controls the timing of its uplink commands to allow processing of the commands. Urgent messages are processed by the HC&C 9 and an attempt is made to reestablish normal communication, verify the source of the urgent message through to telemetry data, and provide override instructions for any inappropriate behavior taken by the module sending the urgent messages.

According to an exemplary embodiment the maximum number of messages that is attempted is five before forcing the modules into a soft reset, in order to reestablish normal communication. This reset may be enacted by sending a series of 0xFF (three or four bytes as determined experimentally), which causes the module watchdog timer (not shown) to timeout and cause the board to reinitialize.

Although there is no limitation to the voltage that may be attained by the VLTI architecture, there is an appropriate reduction is data rates as more blocks are added to the string of batteries. Improvements in speed may be made by selection of transistors with lower gate capacitance, reduction in gate impedance, careful selection of components, etc. However, one skilled in the art will appreciate that care must be taken not to exceed voltage limitations of the transistors selected.

According to the embodiments of the invention, peak currents of only 2 milliamps allow the use of very small transistors. Also, the reduction in resistances in key portions of the circuit will significantly improve the speed performance of the VLTI at a cost of increased current consumption in the battery.

VLTI Extensions

The VLTI may directly extended to other battery signal generation and interlock controls where offset voltages normally would require optical couplers or isolation amplifiers. For example, combining multiple off the shelf battery protection circuits to control the primary power switches in a battery product that contains more cells than the circuit is nominally designed to form an integrated battery design. Serial communication between integrated circuits that are at an higher or lower offset voltage are also contemplated. Modes of serial communication that can be used include RS232, clock and data combined links, Manchester encoded, or pulse width modulated serial links.

The VLTI interface makes use of the fact that a battery string is made up of cells that have quantifiable offsets. These offsets are usually small incremental steps that enable a telemetry which eschews expensive galvanic isolation and steps the information from one pre-determined level to the next using standard components such as transistors and resistors.

The VLTI approach sends the typical telemetry message up or down the battery string at a step of 10 volts to 30 Volts at a time. Since these steps are within a narrow range of voltages, the information is stepped or translated for one telemetry converter assembly to the next. The offset or step voltages can be accommodated through good design practice to pass messages while overcoming these offsets at a wide variety of frequencies, including DC. Hence, it overcomes the low frequency limitations of the AC coupling or transformer coupling. It can readily be used to communicate through RS-232 like NRZ formats with a complex error resilient protocol.

According to the invention, the VLTI does not require the use of costly level shifting or DC blocking devices, such as, optical couplers, transformers, special purpose AC coupled transmitters, or isolation amplifiers, of conventional battery monitoring systems that are typically connected to each individual battery or cell of the overall high voltage battery. As a result, the VLTI has no physical limitation due to an isolation voltage. In other words, the VLTI can accommodate as high a voltage as the string of cells need without concern for the need to provide isolation for the voltage.

Of course one skilled in the art will appreciate that there are limits as to how fast communications can take place between the HC&C 9 and the modules due to spreading and distortion of the information waveforms as the number of modules is increase. However, this may be overcome by slowing down the frequency or baud rate used in the communication process. As batteries are typically slow speed devices, this is not usually a problem under normal battery string voltages of 400 to 500 Volts. As a result, the embodiments according to the present invention provide a significant reduction in cost in addition to greater flexibility due to the enhanced adaptability to different design requirements.

The present invention has been described by way of example, and modifications and variations of the exemplary embodiments will suggest themselves to skilled artisans in this field without departing from the spirit of the invention. For example, one skilled in the art would appreciate that different configurations for connecting the power sources to the assembly could also be implemented according to the present invention. The preferred embodiments are merely illustrative and should not be considered restrictive in any way. The scope of the invention is to be measured by the appended claims, rather than the preceding description, and all variations and equivalents that fall within the range of the claims are intended to be embraced therein.

What is claimed is:

1. A battery monitoring system for monitoring a plurality of batteries comprising:
    a plurality of modules connected in series for monitoring a respective one of said plurality of batteries;
    a processor for transmitting uplink signals to said plurality of modules and receiving downlink signals from said plurality of modules in order to monitor and control the operation of said batteries associated with said modules;
    a serial bus including uplink data lines and downlink data lines for interconnecting said processor and said plurality of modules, wherein each of said modules comprises:
        an uplink communication receiver unit for receiving and transmitting said uplink signals from said host command and controller via said uplink data lines and translating a voltage level of said uplink signals to a higher voltage level of a next module in said uplink data stream without using galvanic isolation; and
        a downlink communication transmitter unit for receiving and transmitting said downlink signals from said modules to said processor via said downlink data lines and translating a voltage level of said downlink signals to a lower voltage level of a next module in said downlink data stream without using galvanic isolation.

2. The battery monitoring system of claim 1, wherein said modules include a microcontroller, each microcontroller having an address, said microcontroller reading said uplink signals that are addressed to the microcontroller and executing specified functions in response to said uplink signals.

3. The battery monitoring system of claim 2, wherein said microcontrollers generate said downlink signals in response to said uplink signals addressed to said microcontrollers.

4. The battery monitoring system of claim 2, wherein said uplink communications receiver unit comprises a plurality of receivers and said downlink transmitter unit comprises a plurality of transmitters wherein said transmitters and receivers comprise at least one transistor forming an inverting translation input buffer for translating said voltage levels of said uplink and downlink signals.

5. The battery monitoring system of claim 1 further comprising a safety interlock for signaling said processor that one of said modules requires immediate attention due to the occurrence of a specified condition.

6. The battery monitoring system of claim 5, wherein said processor sends a command in response to safety interlock signal addressed to each module to control said module requiring immediate attention in response to said specified condition.

7. The battery monitoring system of claim 5 wherein said specified condition is at least one of an over voltage condition; and over discharge condition; or and over temperature condition.

8. A module for use in a battery monitoring system including a plurality of said modules and a processor, said module comprising:
    a microcontroller for monitoring at least one battery cell;
    a plurality of receivers connected to said microcontroller for receiving and transmitting uplink signals from said processor in an uplink data stream;
    a plurality of transmitters connected to said microcontroller for receiving and transmitting downlink signals to said processor in a downlink data stream, wherein
    said plurality of receivers and transmitters allow said module to be connected to one of said processor or said plurality of modules, in series, and translate a voltage level of said uplink signals and said downlink signals to a voltage level of a next module in said uplink data stream and said downlink data stream, respectively, without using galvanic isolation.

9. The module of claim 8, wherein said receivers and transmitters comprise at least one transistor forming an inverting translation input buffer for translating said voltage level of said received or transmitted signals.

10. The module of claim 8, wherein said microcontroller monitors said uplink data stream for uplink signals addressed to said microcontroller.

11. The module of claim 8, further comprising a safety interlock for signaling that said module requires immediate control due to the occurrence of a specified condition.

12. The module of claim 11, wherein said specified condition is at least one of an over voltage condition; and over discharge condition; or and over temperature condition.

13. A high voltage battery comprising:
    a plurality of modules connected in series, each of said modules comprising:

at least one cell;

a plurality of receivers forming a serial communications uplink connected to said modules for receiving uplink signals;

a plurality of transmitters forming a serial communications downlink connected to said modules for transmitting downlink signals, wherein said receivers and transmitters translate a voltage level of each of said uplink signals and said downlink signals to a voltage level associated with a next module in said uplink data stream and said downlink data stream, respectively, without using galvanic isolation.

14. The high voltage battery of claim 13, wherein each of said modules further comprises a microcontroller for reading said received uplink signals addressed to said modules and transmitting said transmitted downlink signals in response to said addressed signals.

15. The high voltage battery of claim 14, wherein said receivers and transmitters comprise at least one transistor forming an inverting translation input buffer for translating the voltage level of said uplink and downlink signals.

16. The high voltage battery of claim 13 further comprising a safety interlock for signaling that said module requires immediate control due to the occurrence of a specified condition.

17. The high voltage battery of claim 16, wherein said specified condition is at least one of an over voltage condition, an over discharge condition, or an over temperature condition.

* * * * *